(12) United States Patent
Maleki et al.

(10) Patent No.: US 8,565,274 B2
(45) Date of Patent: Oct. 22, 2013

(54) OPTICAL LOCKING BASED ON OPTICAL RESONATORS WITH HIGH QUALITY FACTORS

(75) Inventors: Lute Maleki, Pasadena, CA (US); Andrey B. Matsko, Pasadena, CA (US); Anatoliy A. Savchenkov, Glendale, CA (US); Vladimir S. Iichenko, Arcadia, CA (US); Wei Liang, Monrovia, CA (US); David Seidel, Alta Loma, CA (US); Jerry Byrd, Pasadena, CA (US)

(73) Assignee: OEwaves, Inc., Pasadena, CA (US)

( * ) Notice: Subject to any disclaimer, the term of this patent is extended or adjusted under 35 U.S.C. 154(b) by 334 days.

(21) Appl. No.: 13/004,809

(22) Filed: Jan. 11, 2011

(65) Prior Publication Data
US 2011/0110387 A1 May 12, 2011

Related U.S. Application Data

(63) Continuation-in-part of application No. 12/381,519, filed on Mar. 11, 2009, now Pat. No. 7,869,472.

(60) Provisional application No. 61/035,608, filed on Mar. 11, 2008, provisional application No. 61/053,411, filed on May 15, 2008, provisional application No. 61/058,487, filed on Jun. 3, 2008.

(51) Int. Cl.
*H01S 3/10* (2006.01)
(52) U.S. Cl.
USPC ............ 372/20; 372/26; 372/28; 372/29.011; 372/32

(58) Field of Classification Search
USPC .................. 372/20, 26, 28, 29.011
See application file for complete search history.

(56) References Cited

U.S. PATENT DOCUMENTS

| | | |
|---|---|---|
| 4,835,782 A | 5/1989 | Kaede et al. |
| 5,073,331 A | 12/1991 | Shirasaki |
| 5,185,643 A | 2/1993 | Vry et al. |
| 5,204,640 A | 4/1993 | Logan, Jr. |
| 5,220,292 A | 6/1993 | Bianchini et al. |
| 5,723,856 A | 3/1998 | Yao et al. |
| 5,751,747 A | 5/1998 | Lutes et al. |
| 5,777,778 A | 7/1998 | Yao |
| 5,917,179 A | 6/1999 | Yao |
| 5,929,430 A | 7/1999 | Yao et al. |
| 5,985,166 A | 11/1999 | Unger et al. |
| 6,080,586 A | 6/2000 | Baldeschwieler et al. |
| 6,178,036 B1 | 1/2001 | Yao |

(Continued)

FOREIGN PATENT DOCUMENTS

| | | |
|---|---|---|
| JP | 01205486 | 8/1989 |
| JP | 04-096386 | 3/1992 |

(Continued)

OTHER PUBLICATIONS

International Search Report and Written Opinion dated Sep. 30, 2009 for International Application No. PCT/US2009/001574, filed Mar. 11, 2009 (7 pages).

(Continued)

*Primary Examiner* — Dung Nguyen
(74) *Attorney, Agent, or Firm* — Perkins Coie LLP

(57) ABSTRACT

Techniques and devices for providing optical locking of optical resonators and lasers.

7 Claims, 12 Drawing Sheets

(56) References Cited

U.S. PATENT DOCUMENTS

| | | |
|---|---|---|
| 6,203,660 B1 | 3/2001 | Unger et al. |
| 6,389,197 B1 | 5/2002 | Iltchenko et al. |
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,517 B2 | 6/2003 | Lokai et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 | 5/2006 | Matsko et al. |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1* | 4/2008 | Ilchenko et al. ............... 385/15 |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,630,417 B1 | 12/2009 | Maleki et al. |
| 7,738,527 B2 | 6/2010 | He |
| 7,869,472 B2 | 1/2011 | Maleki et al. |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1* | 6/2005 | Ilchenko et al. ............... 398/161 |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2008/0001062 A1 | 1/2008 | Gunn et al. |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 | 5/2009 | Maleki et al. |

FOREIGN PATENT DOCUMENTS

| | | |
|---|---|---|
| JP | 05-095153 | 4/1993 |
| JP | 05-190967 | 7/1993 |
| JP | 05-198887 | 8/1993 |
| JP | 11-274643 | 10/1999 |
| JP | 2006-515081 A | 5/2006 |
| WO | 01/96936 | 12/2001 |
| WO | 2004070432 A2 | 8/2004 |
| WO | 2005/038513 | 4/2005 |
| WO | 2005/055412 | 6/2005 |
| WO | 2005/067690 | 7/2005 |
| WO | 2005/122346 | 12/2005 |
| WO | 2006/076585 | 7/2006 |
| WO | 2007/143627 | 12/2007 |

OTHER PUBLICATIONS

Braginsky, V.B., et al., "Quality-Factor and Nonlinear Properties of Optical Whispering-Gallery Modes," Physics Letters A, 137(7, 8):393-397, May 1989.

Eliyahu, D., et al., "Low Phase Noise and Spurious Levels in Multi-Loop Opto-Electronic Oscillators," Proceedings of the 2003 IEEE International Frequency Control Sympoium and PDA Exhibition, pp. 405-410, May 2003.

Eliyahu, D., et al., "Modulation Response (S.sub.21) of the Coupled Opto-Electronic Oscillator," Proceedings of the 2005 IEEE International Frequency Control Symposium and Exposition, pp. 850-856, Aug. 2005.

Eliyahu, D., et al., "Tunable, Ultra-Low Phase Noise YIG Based Opto-Electronic Oscillator," IEEE MTT-S International Microwave Symposium Digest, 3:2185-2187, Jun. 2003.

Gorodetsky, M.L., et al., "Optical Microsphere Resonators: Optimal Coupling to High-Q Whispering-Gallery Modes," J. Opt. Soc. Am. B, 16(1):147-154, Jan. 1999.

Gorodetsky, M.L., et al., "Rayleigh Scattering in High-Q Microspheres," J. Opt. Soc. Am. B, 17(6):1051-1057, Jun. 2000.

Gorodetsky, M.L., et al., "Ultimate Q of Optical Microsphere Resonators," Optics Letters, 21(7):453-455, Apr. 1996.

Hryniewicz, J.V., et al., "Higher Order Filter Response in Coupled Microring Resonators," IEEE Photonics Technology Letters, 12(3):320-322, Mar. 2000.

Huang, S., et al., "A 'Turnkey' Optoelectronic Oscillator with Low Acceleration Sensitivity," 2000 IEEE/EIA International Frequency Control Symposium and Exhibition, pp. 269-279, Jun. 2000.

Ilchenko, V., et al., "Electrooptically Tunable Photonic Microresonators and Photonic Bandgap Waveguide Coupling for Micro-Optoelectronic Oscillators," GOMACTech 2003, Tampa, Florida, pp. 1-4.

Ilchenko, V., et al., "High-Q Microsphere Cavity for Laser Stabilization and Optoelectronic Microwave Oscillator," Proceedings SPIE Microresonators and Whispering-Gallery Modes, vol. 3611, pp. 190-198, Jan. 1999.

Ilchenko, V., et al., "Microsphere Integration in Active and Passive Photonics Devices," Proc. of SPIE Laser Resonators III, vol. 3930, pp. 154-162, Jan. 2000.

Ilchenko, V., et al., "Microtorus: A High-Finesse Microcavity with Whispering-Gallery Modes," Optics Letters, 26 (5):256-258, Mar. 2001.

Ilchenko, V., et al., "Pigtailing the High-Q Microsphere Cavity: A Simple Fiber Coupler for Optical Whispering-Gallery Modes," Optics Letters, 24(11):723-725, Jun. 1999.

Ilchenko, V., et al., "Tunability and Synthetic Lineshapes in High-Q Optical Whispering Gallery Modes," Proc. of SPIE Laser Resonators and Beam Control VI, vol. 4969, pp. 195-206, Jan. 2003.

Ilchenko, V., et al., "Whispering-Gallery-Mode Electro-Optic Modulator and Photonic Microwave Receiver," J. Opt. Soc. Am. B, 20(2):333-342, Feb. 2003.

Ilchenko, V., et al., "Sub-Micro Watt Photonic Microwave Receiver," IEEE Photonics Technology Letters, 14 (11):1602-1604, Nov. 2002.

(56) References Cited

OTHER PUBLICATIONS

Ito, H., et al., "InP/InGaAs Uni-Travelling-Carrier Photodiode with 310 GHz Bandwidth," Electronics Letters, 36 (21):1809-1810, Oct. 2000.

Logan, R., et al., "Stabilization of Oscillator Phase Using a Fiber-Optic Delay-Line," IEEE 45.sup.th Annual Symposium on Frequency Control, pp. 508-512, May 1991.

Maleki, L., "The Opto-Electronic Oscillator: Prospects for Extending the State of the Art in Reference Frequency Generation," International Topical Meeting on Microwave Photonics, pp. 195-198, Oct. 1998.

Matsko, A., et al., "Active Mode Locking with Whispering-Gallery Modes," J. Opt. Soc. Am. B, 20(11):2292-2296, Nov. 2003.

Matsko, A., et al., "Whispering-Gallery-Mode based Optoelectronic Microwave Oscillator," Journal of Modern Optics, 50(15-17):2523-2542, Feb. 2004.

Matsko, A., et al., "Whispering-Gallery-Mode Resonators as Frequency References. I. Fundamental Limitations," J. Opt. Soc. Am. B, 24(6):1324-1335, Jun. 2007.

Myers, Le., et al., "Quasi-Phase-Matched Optical Parametric Oscillators in Bulk Periodically Poled $LiNbO_3$," J. Opt. Soc. Am. B, 12(11):2102-2116, Nov. 1995.

Savchenkov, A., et al., "Whispering-Gallery-Mode Resonators as Frequency References. II. Stabilization," J. Opt. Soc. Am. B, 24(12):2988-2997, Dec. 2007.

Vassiliev, V.V., et al., "Narrow-Line-Width Diode Laser with a High-Q Microsphere Resonator," Optics Communications, 158(1-6):305-312, Dec. 1998.

Yao, X.S., et al., "A Novel Photonic Oscillator," Digest of the LEOS Summer Topical Meetings, pp. 17-18, Aug. 1995.

Yao, X.S., et al., "A Novel Photonic Oscillator," TDA Progress Report 42-122, pp. 32-43, Aug. 1995.

Yao, X.S., et al., "Converting Light into Spectrally Pure Microwave Oscillation," Optics Letters, 21(7):483-485, Apr. 1996.

Yao, X.S. et al. "Coupled Optoelectronic Oscillators for Generating Both RF Signal and Optical Pulses," Journal of Lightwave Tecnhology, 18(1):73-78, Jan. 2000.

Yao, X.S., et al., "Dual Microwave and Optical Oscillator," Optics Letters, 22(24):1867-1869, Dec. 1997.

Yao, X.S., et al., "Multiloop Optoelectronic Oscillator," IEEE Journal of Quantum Electronics, 36(1):79-84, Jan. 2000.

Yao, X.S., et al., "Optoelectronic Microwave Oscillator," J. Opt. Soc. Am. B, 13(8):1725-1735, Aug. 1996.

Yao, X.S., et al., "Optoelectronic Oscillator for Photonic Systems," IEEE Journal of Quantum Electronics, 32 (7):1141-1149, Jul. 1996.

Yu, J., et al., "Compact Optoelectronic Oscillator with Ultra-Low Phase Noise Performance," Electronics Letters, 35 (18):1554-1555, Sep. 1999.

Supplementary European Search Report dated Feb. 12, 2013 issued by European Patent Office in corresponding European patent application No. 09720344.2.

\* cited by examiner

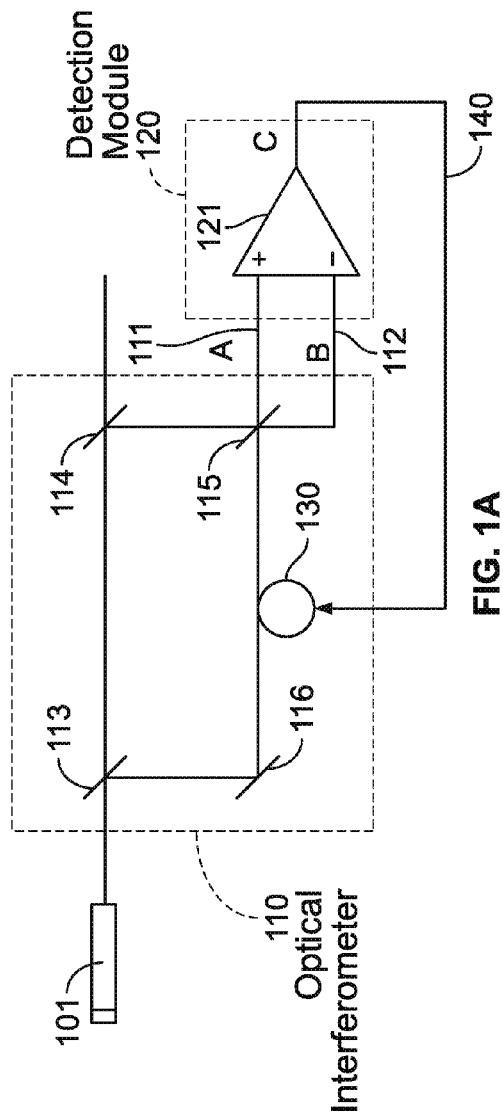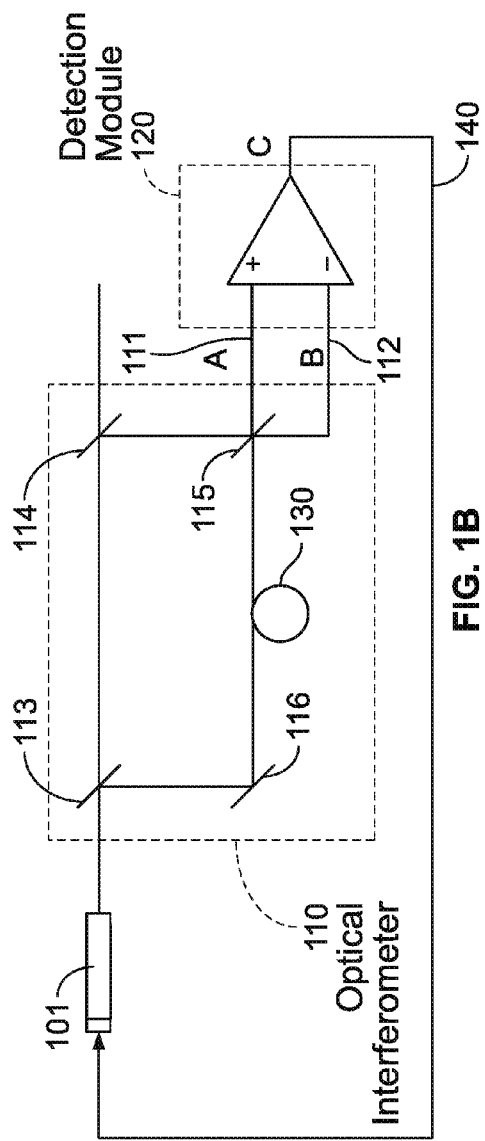

Saturated Amplifier Gives Additional Advantages

ASSUME THE TRANSMISSION IS T(ω) AND THE RESONANCE FREQUENCY IS ω₀. WHEN THE FREQUENCY OF THE INCOMING SIGNAL IS SLOWLY VARYING COMPARED TO THE RESPONSE OF THE RESONATOR, THE OUTPUT OF THE RESONATOR IS $$E_1 = T(\omega)E_0 e^{i\omega t}$$

$$E_t = tE_0 + E_\ell = T(\omega)E_0$$

$E_t$ : TRANSMITTED FIELD $E_\ell$ : LEAKED FIELD FROM THE CAVITY $tE_0$ : DIRECT COUPLING FROM THE INCIDENT FIELD AND THE DETECTED POWER IS $P = |E_0 e^{i\omega t}(1+T(\omega))|^2$ ASSUMING SMALL FREQUENCY DETUNING $\delta\omega = \omega - \omega_0 < \delta\upsilon$, and $T(\omega) \sim i\delta\omega/\delta\upsilon$ DIFFERENTIATE P AGAINST T AND MIX THE SIGNAL WITH A PHASE-SHIFTED VERSION OF ITSELF DOESN'T PROVIDE AN ERROR SIGNAL PROPORTIONAL TO THE FREQUENCY DEVIATION.

FIG. 4B

TO UNDERSTAND WHAT HAPPENS WHEN THE FREQUENCY CHANGES FASTER THAN THE RESPONSE OF THE CAVITY, WE FIRST LOOK AT THE COUPLING BETWEEN THE WAVEGUIDE AND THE RESONATOR.

$$E_t = tE_0 e^{i\omega t} + E_\ell = T(\omega)E_0 e^{i\omega t}$$

$E_t$ : TRANSMITTED FIELD
$E_\ell$ : LEAKED FIELD FROM THE CAVITY
$tE_0$ : DIRECT COUPLING FROM THE INCIDENT FIELD $$E_\ell = [T(\omega)-t]E_0 e^{i\omega t}$$

ABOVE RELATION SHOULD WORK FOR ANY FREQUENCY. WHEN THE FREQUENCY OF THE INCIDENT FIELD SUDDENLY CHANGES FROM $\omega_0$ TO $\omega$, THE TRANSMITTED FIELD IS $$E_t = tE_0 e^{i\omega t} + E_\ell(\omega_0) = tE_0 e^{i\omega t} + [T(\omega_0)-t]E_0 e^{i\omega_0 t - \alpha t} = E_1$$

IN ABOVE EQUATION, I HAVE ASSUMED THE FREQUENCY DETUNING $\delta\omega \gg \delta\upsilon$, AND HENCE THE FIELD AT FREQUENCY $\omega$ WILL NOT BUILD UP IN THE RESONATOR, THE CORRESPONDING LEAKED FIELD FROM THE RESONATOR AT FREQUENCY $\omega$ CAN BE IGNORED.

THE SECOND PATH IS ACTUALLY NOT NECESSARY, THE DETECTED POWER IS $$P_t = |E_t|^2 = P_0\{|t|^2 + |T(\omega_0)-t|^2 e^{-2\alpha t} + 2\mathrm{Re}\{t[T^*(\omega_0) - t^*]e^{i(\omega-\omega_0)t - \alpha t}\}\} \text{ WHERE } \alpha = \pi\delta\upsilon$$

$P_t$ CONTAINS A SINUSOIDAL TERM, IF DIFFERENTIATE IT AND MIX THE SIGNAL WITH A $\pi/2$ PHASE SHIFTED VERSION OF ITSELF, THE OUTPUT DC COMPONENT IS PROPORTIONAL TO $$\varepsilon = \delta\omega \cdot u(t) * f(t) \sim \delta\omega \cdot e^{-2\alpha t} u(t)$$

ABOVE EQUATION IS ESSENTIALLY THE RESPONSE OF THE FREQUENCY DETECTOR TO THE STEP CHANGE OF THE FREQUENCY, IF WE TAKE THE LAPLACE TRANSFORM $$L[u(t) * f(t)] = L[u(t)] \cdot L[f(t)] = \frac{F(s)}{s} \sim \frac{1}{s+2\alpha}$$

AND THE RESPONSE OF THE FREQUENCY DETECTOR $F(s) \sim \frac{s}{s+2\pi\delta\upsilon} \sim \frac{s}{s+2\alpha}$ WHICH HAS A HIGH PASS PROPERTY

FIG. 4C

OPTICAL LOCKING BASED ON OPTICAL RESONATORS WITH HIGH QUALITY FACTORS

PRIORITY CLAIMS AND RELATED PATENT APPLICATIONS

This application is a divisional application (and claims the benefit of priority under 35 USC §121) of U.S. application Ser. No. 12/381,519 entitled "Optical Locking Based on Optical Resonators with High Quality Factors" and filed Mar. 11, 2009, which claims priority to U.S. Provisional Application 61/035,608 entitled "Tunable Narrow-Linewidth Injection-Locked Semiconductor Lasers with High-Q Whispering-Gallery Mode Resonators" and filed on Mar. 11, 2008, U.S. Provisional Application No. 61/053,411 entitled "Very Precise Optical Lock For Balanced WGMR Based Filter" and filed on May 15, 2008, and U.S. Provisional Application No. 61/058,487 entitled "All Optical Lock For Photonic Applications" and filed on Jun. 3, 2008. The entire disclosures of the above patent applications are incorporated by reference as part of the disclosure of this document.

BACKGROUND

This document relates to devices based on optical resonators.

Optical resonators can be configured to exhibit high resonator quality factors for various applications, such as optical frequency references and optical filtering devices. A whispering gallery mode (WGM) resonator, for example, has a structure that confines light in a whispering gallery mode that is totally reflected within a closed circular optical path. Light in WGM resonators cannot exit the resonators by optical transmission and thus can be used to produce optical resonators with high optical quality factors that may be difficult to achieve with Febry-Perot resonators. Light in a WGM resonator "leaks" out of the exterior surface of the closed circular optical path of a WGM resonator via the evanescence field of the WG mode.

SUMMARY

This document describes implementations of techniques and devices for providing optical locking of optical resonators and lasers.

In one aspect, this document provides a device that includes a laser that produces a laser, an optical interferometer, and an optical resonator coupled to the optical interferometer. The laser produces a laser output beam at a laser frequency. The optical interferometer is located in an optical path of the laser output beam and includes a first optical path that receives a first portion of the laser output beam, a second optical path that receives a second portion of the laser output beam, and an optical combiner where the first and second optical paths meet each other and terminate. The optical combiner transmits a part of light from the first optical path and reflects a part of light from the second optical path to produce a first combined optical output. The optical combiner also transmits a part of the light from the second optical path and reflects a part of the light from the first optical path to produce a second combined optical output. The optical resonator is optically coupled in the first optical path to filter light in the first optical path. This device includes a detection module that detects the first and the second combined optical outputs to produce an error signal representing a frequency difference between the laser frequency and a resonance of the optical resonator, and a feedback control mechanism that receives the error signal and tunes, one of (1) the laser and (2) the optical resonator, in response to the frequency difference of the error signal to lock the laser and the optical resonator with respect to each other.

In another aspect, a method for locking a laser and an optical resonator to each other is described to include operating a laser to produce a laser output beam at a laser frequency without modulating the laser beam; directing laser light of the laser output beam into an optical interferometer which includes a first optical path and a second optical path that intersect to produce optical interference between light in the first and second optical paths; optically coupling an optical resonator in the first optical path to filter light in the first optical path; using two optical outputs of the optical interferometer to produce an error signal representing a frequency difference between the laser frequency of the laser and a resonance of the optical resonator; and tuning one of (1) the laser and (2) the optical resonator, in response to the frequency difference of the error signal, to lock the laser and the optical resonator with respect to each other.

In another aspect, a device is provided to stabilize a resonance of an optical resonator with respect to a laser frequency from a laser. This device includes a laser that produces a laser output beam at a laser carrier frequency; an optical resonator placed in an optical path of the laser output beam to receive light of the laser output beam; and an optical coupler that couples the optical resonator to the optical path to receive the light of the laser output beam and to produce an optical output. The optical coupler is structured and positioned relative to the optical resonator to provide, at an optical filter mode frequency different from the laser carrier frequency, optical coupling that is not under a critical coupling condition under which light coupled into the optical resonator is completely trapped inside the optical resonator. The device includes an optical modulator, in the optical path of the laser output beam between the laser and the optical resonator, to modulate the laser output beam to produce a modulation sideband at which optical coupling of the light in the modulation sideband by the optical coupler into the optical resonator is near the critical coupling condition to thermally stabilize the resonator by optical absorption of light in the modulation sideband. The modulation sideband is different in frequency from the optical filter mode frequency.

In another aspect, a method for operating an optical resonator filter is provided to include directing to an optical resonator a resonator controlling laser beam at a laser carrier frequency that is modulated to carry a modulation sideband; operating an optical coupler to couple light at the modulation sideband into the optical resonator near a critical coupling condition under which light coupled into the optical resonator is completely trapped inside the optical resonator to thermally stabilize the resonator by optical absorption of light in the modulation sideband; and directing an input optical signal, while the resonator is receiving and is thermally stabilized by the resonator controlling laser beam, through the optical resonator to perform optical filtering of the input optical signal by a resonance of the optical resonator at an optical filter mode frequency that is different from the modulation sideband and the laser carrier frequency of the resonator controlling laser beam.

In yet another aspect, a device for locking a laser to an optical resonator is provided to include a distributed feedback (DFB) laser that is tunable in response to a control signal and produces a laser beam at a laser frequency; an optical resonator structured to support a whispering gallery mode circulating in the optical resonator and optically coupled to the DFB laser to receive a portion of the laser beam into the optical resonator in the whispering gallery mode and to feed laser light in the whispering gallery mode in the optical resonator back to the DFB laser to stabilize the laser frequency at a frequency of the whispering gallery mode and to reduce a linewidth of the DFB laser. This device also includes a resonator tuning mechanism that controls and tunes the frequency of the whispering gallery mode to tune the laser frequency of the DFB laser via the feedback of the laser light from the optical resonator to the DFB laser.

These and other aspects and implementations are described in detail in the drawings, the description and the claims.

BRIEF DESCRIPTION OF DRAWING

FIGS. 1A through 8 show examples and operations of locking a laser and a resonator to each other via an optical interferometer.

DETAILED DESCRIPTION

Figure 2:
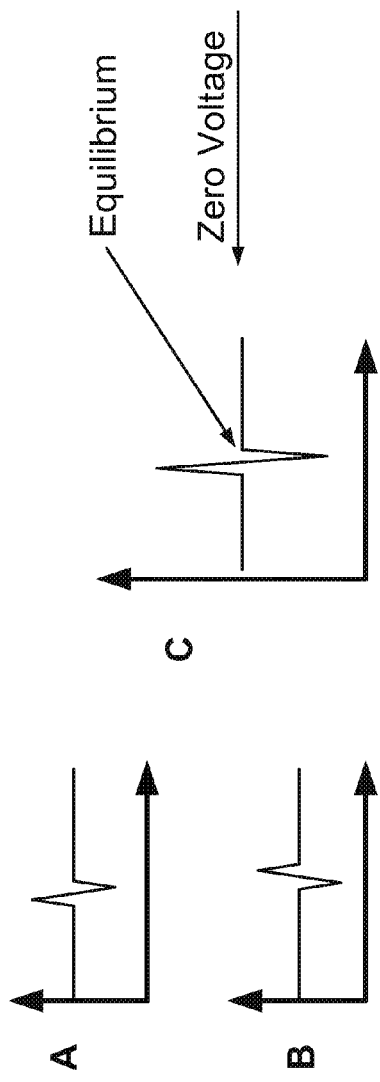

Optical locking techniques and devices described in this document use optical resonators with high quality factors to provide narrow resonator linewidths. An optical resonator with a high quality factor can be locked relative to a laser frequency of a laser or vice versa. Examples below provide techniques and devices for locking a laser and an optical resonator to each other. In implementation, a laser is operated to produce a laser output beam at a laser frequency without modulating the laser beam. The laser light of the laser output beam is directed into an optical interferometer which includes a first optical path and a second optical path that intersect to produce optical interference between light in the first and second optical paths. An optical resonator is coupled in the first optical path to filter light in the first optical path. Two optical outputs of the optical interferometer are used to produce an error signal representing a frequency difference between the laser frequency of the laser and a resonance of the optical resonator. This error signal is then used to control and tune either or both of the laser and the optical resonator, to lock the laser and the optical resonator with respect to each other.

FIGS. 1A and 1B show two example devices for locking a laser and a resonator to each other. The device in FIG. 1A locks the resonator to the laser by tuning the resonator in response to the error signal while the device in FIG. 1B locks the laser to the resonator by tuning the laser in response to the error signal.

In FIGS. 1A and 1B, a laser 101 is used to produce a laser output beam at a laser frequency that is sent into an optical interferometer 110. The optical interferometer 110 in this example is a Mach-Zehnder interferometer and includes an input beam splitter 113 to split input light into a first optical path with a reflector 114 and a second optical path with a reflector 116. The first and second optical paths meet each other and terminate at an optical combiner 115. In this example, the optical combiner 115 can be a partially transmissive and partially reflective optical device that transmits a part of light from the first optical path and reflects a part of light from the second optical path to produce a first combined optical output 111 (A). The optical combiner 115 also transmits a part of the light from the second optical path and reflects a part of the light from the first optical path to produce a second combined optical output 112 (B). An optical resonator 130 is optically coupled in the second optical path to filter light in the second optical path. A WGM resonator can be used as the resonator 130 and an evanescent couple can be used to couple the WGM resonator to the second optical path. A detection module 120 is provided to detect the first and the second combined optical outputs 111 and 112 to produce an error signal representing a frequency difference between the laser frequency of the laser 101 and a resonance of the optical resonator 130. A feedback control 140 is provided to receive the error signal and tunes, one of the laser 101 and the optical resonator 130 to lock the laser 101 and the optical resonator 130 with respect to each other. In some implementations, both the laser 101 and the resonator 130 may be tuned to effectuate the locking.

In FIGS. 1A and 1B, the detection module 120 includes photodetectors, e.g., low-speed photodiodes, to detect the white and dark ports of interferometer 110 and the outputs of the photodetectors are subtracted at a differential amplifier 121. The output of the amplifier 121 represents the error signal. This output, under perfectly balanced two optical paths in the interferometer 110, is at a near-zero voltage at the zero optical detuning between the laser 101 and the resonator 130. The phase of the optical beam in the second optical path with the resonator 130 sharply depends on the frequency of the resonance of the resonator 130 and its bandwidth.

The resonator 130 can be tuned based on various mechanisms. A WGM resonator, for example, can be made from an electro-optic material and can be tuned by changing the electrical control signal applied to the material. In addition, the resonator can be tuned by controlling the temperature of the resonator or by applying a force or pressure to mechanically squeeze the resonator by using an actuator such as a PZT actuator.

Figure 3:
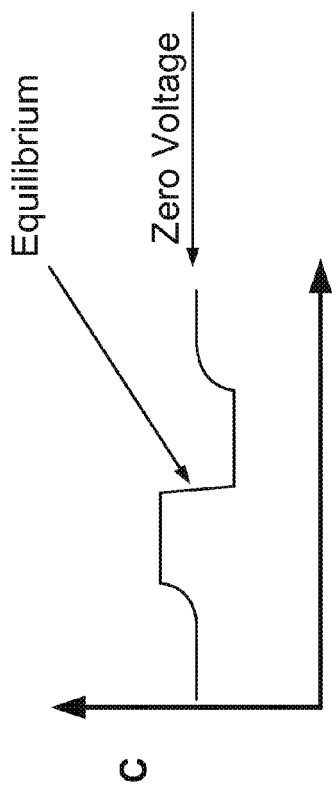

FIG. 2 illustrates signals A, B, and C in FIGS. 1A and 1B. FIG. 3 shows that the output of the amplifier 121 when operated under a saturated condition. The designs in FIGS. 1A and 1B do not require optical modulation of the laser carrier from the laser and can be designed to be in a compact package. The feedback can be designed with a high gain to provide sensitive and effective locking. The locking can be self started within the equilibrium range of the feedback.

The use of the differential signal in FIGS. 1A and 1B limits the locking range to be within the linewidth of a resonance of the resonator 130. This operating range may be insufficiently small for certain applications.

FIGS. 4A-4C and 5 illustrate different implementations of the detection module 120 to provide a broadband locking operation.

Figure 4A:
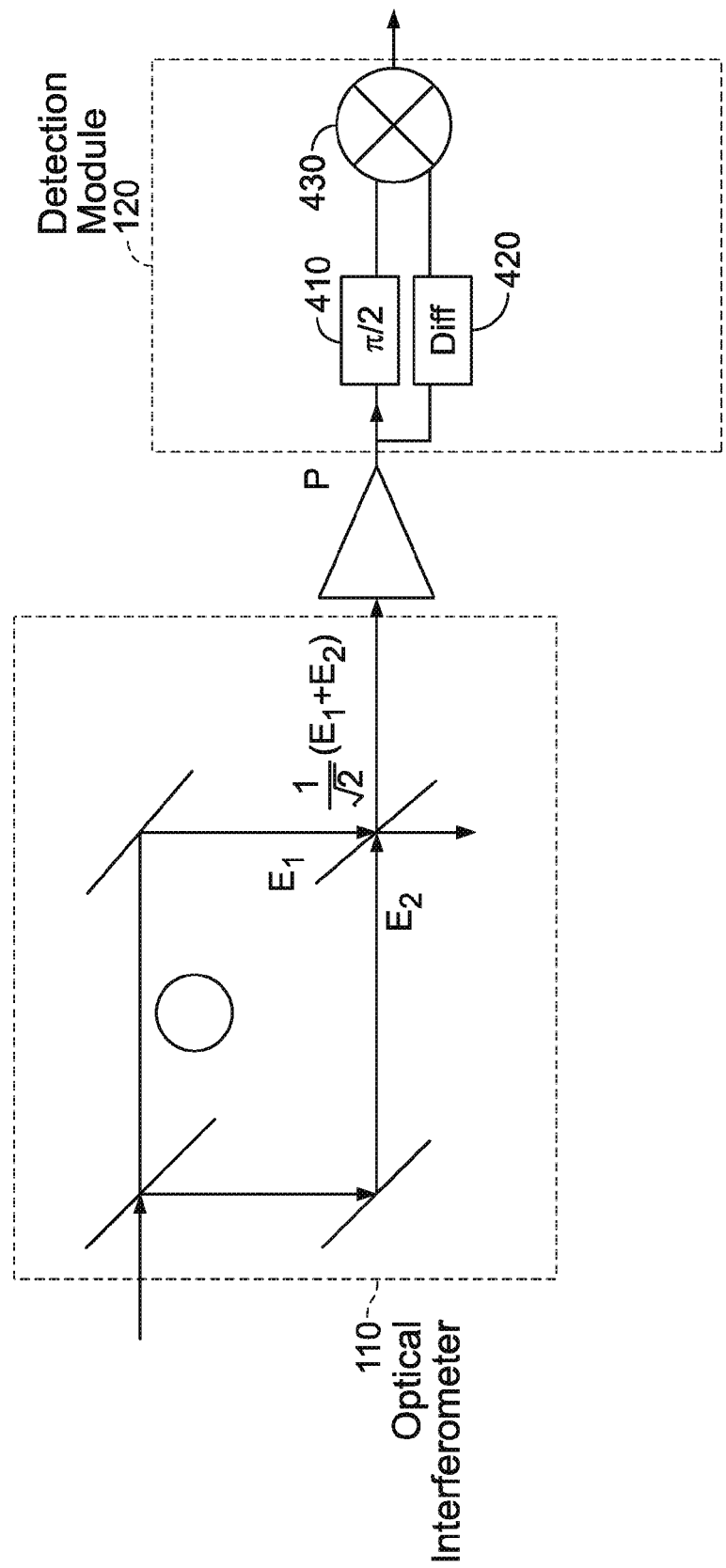

FIG. 4A shows that the output of one of the photodetectors is split into two signals. FIGS. 4B and 4C illustrate the signals and the detection details for the design in FIG. 4A. One signal is shifted in phase by 90 degrees via a phase shifter device 410 and the other signal is sent into a differentiator 420 that generates a differentiated output of the same photodetector. The two processed signals are then directed into a multiplier 430 that multiplies the two processed signals. The result is the error signal which has zero output exactly at the zero frequency detuning between the laser frequency of the laser 101 and the resonance of the resonator 130. The signal grows linearly from the zero detuning condition and has a broad bandwidth which is limited by the bandwidths of RF components used in the detection module 120.

Figure 5:
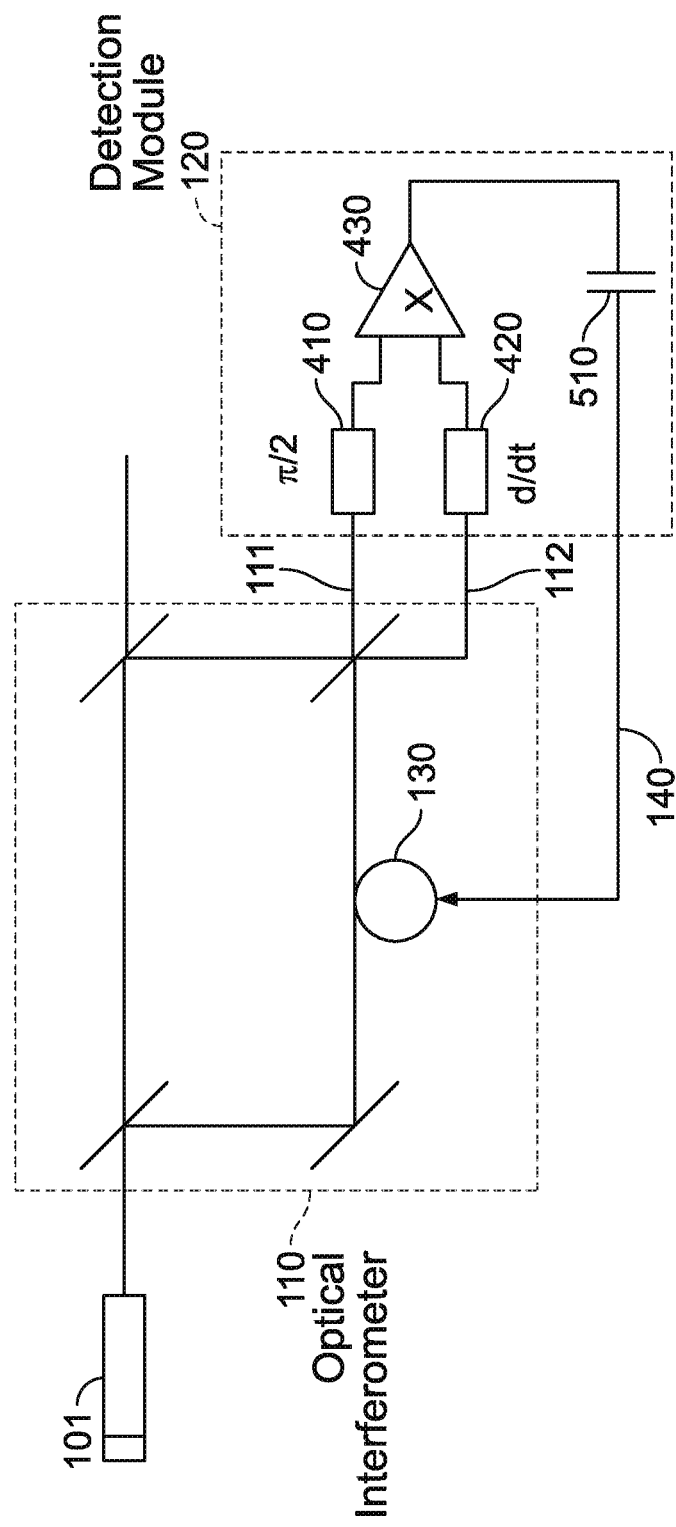

FIG. 5 shows a device for locking the laser 101 and the resonator 130 to each other by using a first signal processing unit 410 that shifts a phase of the first combined optical output 111 to produce a first signal, a second signal processing unit 420 that performs a time derivative of the second combined optical output 112 to produce a second signal. A signal multiplier 430 is then used to multiply the first signal and the second signal to produce a multiplied signal. The detection module 120 uses the multiplied signal to generate the error signal indicating the frequency difference between the laser 101 and the resonator 130.

Figure 6:
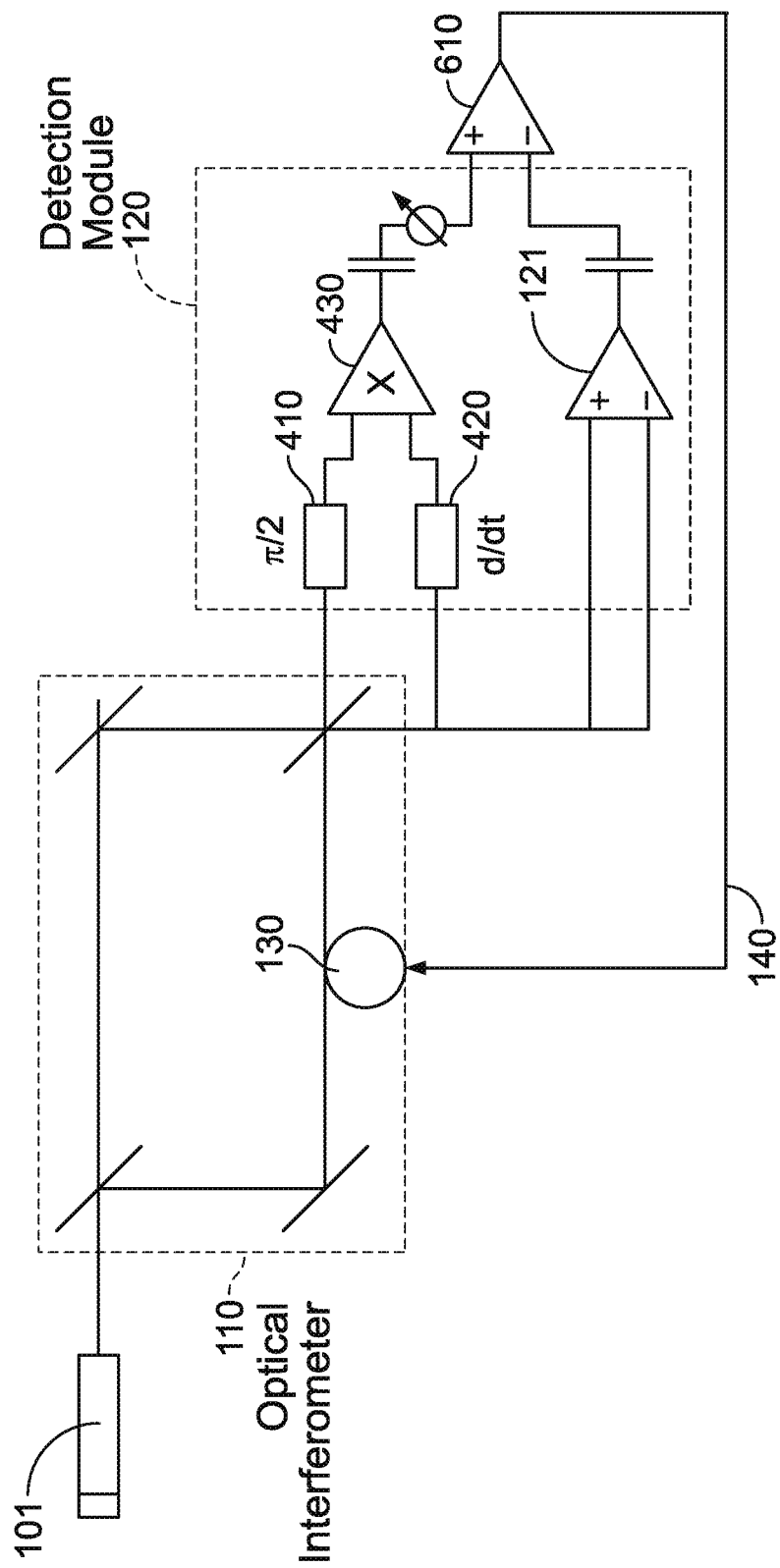

FIG. 6 further shows an example device that uses both the feedback technique in FIGS. 1A and 1B and the feedback technique in FIGS. 4A-4C and 5 to lock the laser 101 and the resonator 130 to each other. In this example, the device 410 is used to shift a phase of one of the two optical outputs of the optical interferometer 110 by 90 degrees to produce a first signal and the device 420 is used to perform a time derivative of the other of the two optical outputs of the optical interferometer 110 to produce a second signal. The multiplier device 430 multiplies the first signal and the second signal to produce a multiplied signal to generate the first error signal indicating the frequency difference. In parallel, the differential amplifier 121 is used to produce a differential signal of power levels of the two optical outputs of the optical interferometer 110 as a second error signal representing the frequency difference between the laser frequency and the resonance of the optical resonator. The feedback 140 then uses both first and second the error signals as inputs to another differential amplifier 610 to produce an output as the error signal to lock the laser 101 and the optical resonator 130 with respect to each other.

Figure 7:
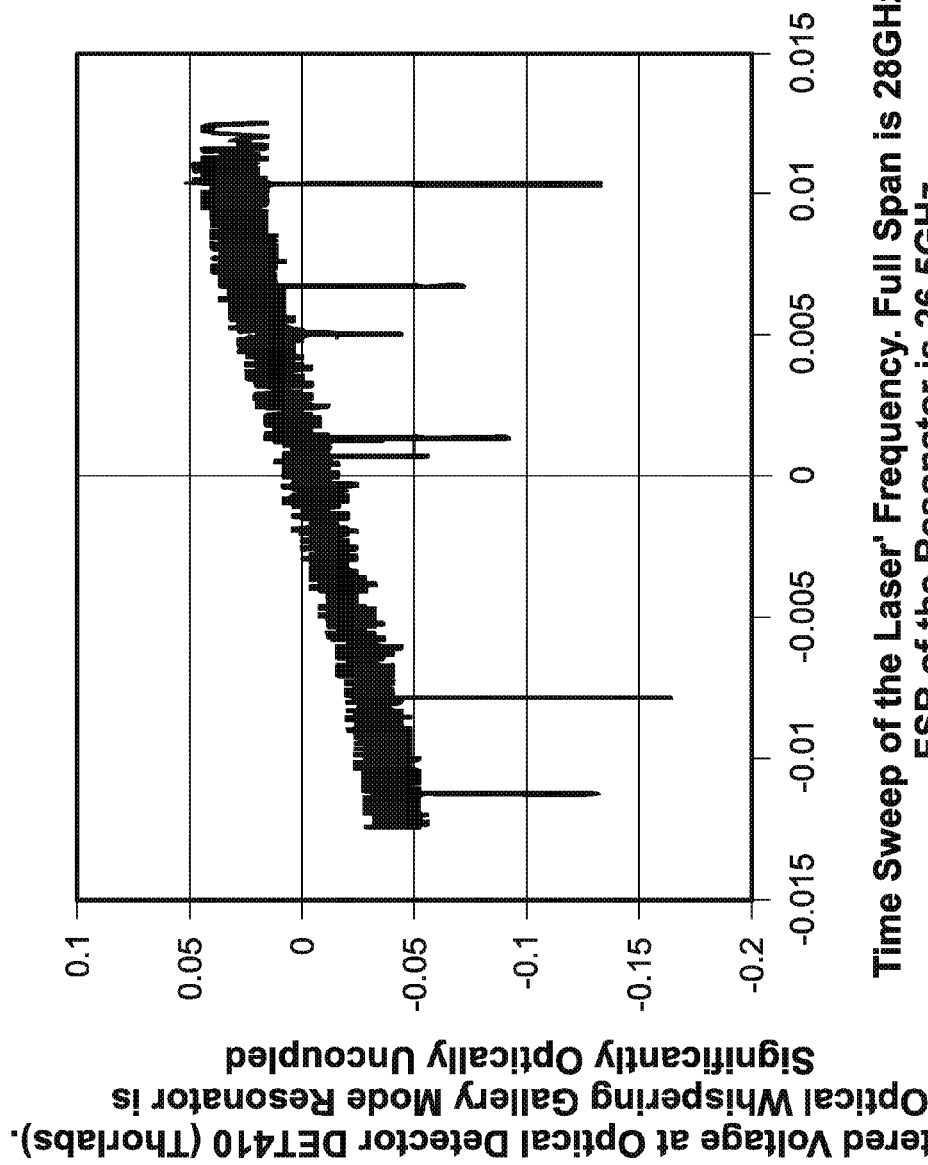
Figure 8:
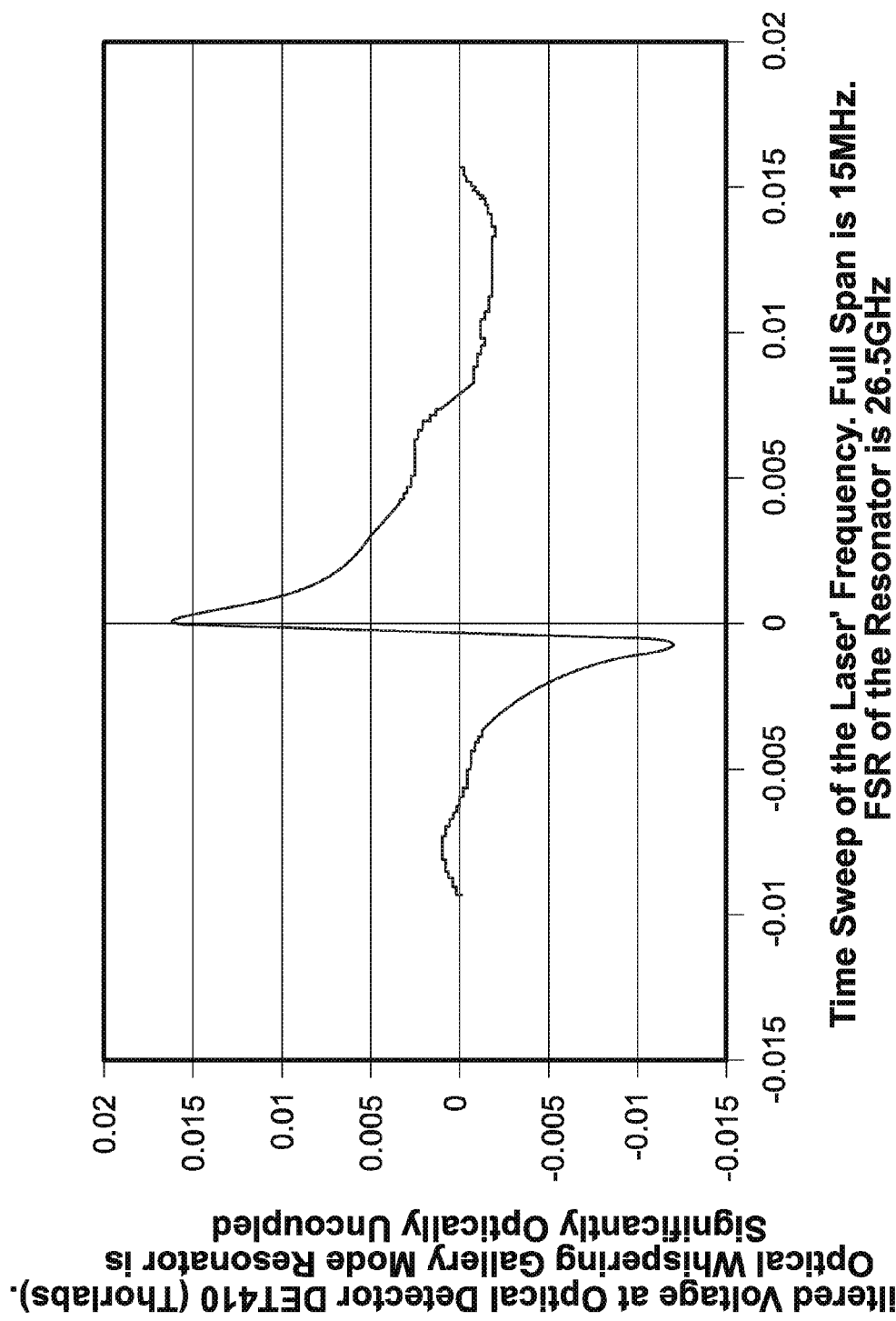

The above techniques were tested using an experimental setup based on a CaF2 high-Q factor whispering gallery mode resonator filter. A 1551-nm laser was used in the setup and the laser output is directed into the fiber coupled filter. A Mach-Zahnder interferometer was assembled with fiber patch-cords and Newport direct fiber-couplers. FIG. 7 shows the measured optical spectrum of the filter and FIG. 8 shows an example of an error signal.

Photonic filters based on whispering gallery mode resonators (wgmr) may require precise tuning of frequency difference between the carrier and the resonant frequency of wgmr in various applications. This difference determines the center of the filtering function of the photonic filter. For instance eigen-frequency of a single 15-MHz wide CaF2 wgmr filter can be stabilized within several MHz for certain applications. This level of frequency stabilization may demand a thermal stabilization of the resonator within a temperature range of about 7 mK. This can be achieved by using a PID driven thermoelectric cooler (TEC) and passive thermal isolation. Some applications require higher stability. For example, a balanced 15M-Hz filter exploits the difference between phases of two resonant lines. This requires sub-MHz stability of frequency which leads to 100 uK level requirement on the thermal stabilization. This level of thermal stabilization may be achieved by using complex multistage TEC controls techniques, some of which require elaborate thermal design of the filter and relatively bulky packaging.

Figure 9:
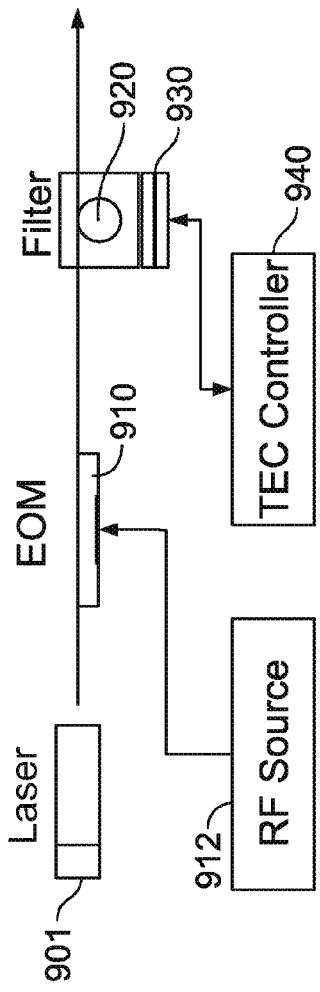
FIGS. 9, 10 and 11 show examples and operations of locking a resonator to a laser by a thermal stabilization using light in a modulation sideband.

The following sections describe techniques and devices that exploit natural thermal nonlinearity of the resonator to control frequency spacing between the laser carrier frequency of the laser and the mode of the resonator. For example, FIG. 9 shows one such device for stabilizing a resonance of an optical resonator with respect. In this device, a laser 901 produces a laser output beam at a laser carrier frequency and an optical resonator filter 920 is placed in an optical path of the laser output beam to receive light of the laser output beam. An optical coupler is provided to couple the optical resonator 920 to the optical path to receive the light of the laser output beam and to produce an optical output. The optical coupler is structured and positioned relative to the optical resonator 920 to provide, at an optical filter mode frequency different from the laser carrier frequency, optical coupling that is not under a critical coupling condition under which light coupled into the optical resonator is completely trapped inside the optical resonator. The device includes an optical modulator 910, in the optical path of the laser output beam between the laser 901 and the optical resonator 920, to modulate the laser output beam to produce a modulation sideband at which optical coupling of the light in the modulation sideband by the optical coupler into the optical resonator 920 is near the critical coupling condition to thermally stabilize the resonator 920 by optical absorption of light in the modulation sideband. The modulation sideband is different in frequency from the optical filter mode frequency. A TEC 930 is in thermal contact with the resonator 920 to control the temperature of the resonator 920 via a control by a TEC controller 940. This thermal control provides a rough DC thermal bias to place the resonator 920 near a desired thermal condition. The modulated laser beam is then used to provide the fine thermal stabilization that thermally locks the resonator 920 to the laser 101.

The laser output beam is modulated at a frequency that is controlled by an RF source or synthesizer 912. The frequency position and the intensity of modulation service sideband can be precisely controlled via controlling the RF power and frequency of the synthesizer 912. The frequency of the modulation is selected so that the service sideband coincides with the auxiliary optical mode which coupling is close but lower than critical coupling condition. The critical coupling condition for optical coupling between the optical coupler and the resonator is a condition that the internal resonator loss and the loss of the optical coupling via the optical coupler are equal and the light coupled into the resonator is completely trapped inside the resonator so that the transmission of the coupled light is zero at the resonance. Under the present design, another mode of the resonator 920, a filtering mode that is used for optical filtering operations, is strongly overcoupled so that the light in the filtering mode is not trapped inside the resonator and can transmit through the resonator 920. Therefore, the service and auxiliary modes show very different thermal nonlinearity from the filtering mode. Practical result of this is that only the auxiliary mode pumped with the service sideband affects the optical frequency of the resonator via the thermal nonlinearity while the signal being filtered at the filtering mode does not affect the thermal condition of the resonator.

Absorption of optical power in auxiliary mode results in a reversible shift of resonator's temperature and a shift in the resonator's refractive index. This change in temperature shifts the frequencies of all optical modes near the resonator's rim. The thermal nonlinearity represents a natural feedback to fix the optical power in the auxiliary mode. Variations of temperature of the resonator or variations of laser's frequency lead to optical heating or cooling of the resonator's rim keeping the service sideband at the slope of the auxiliary optical mode. The feedback gain of this thermal feedback depends on thermal nonlinearity of the resonator, mode volume, thermal conductivity and thermal capacity of the resonator's body.

Figure 10:
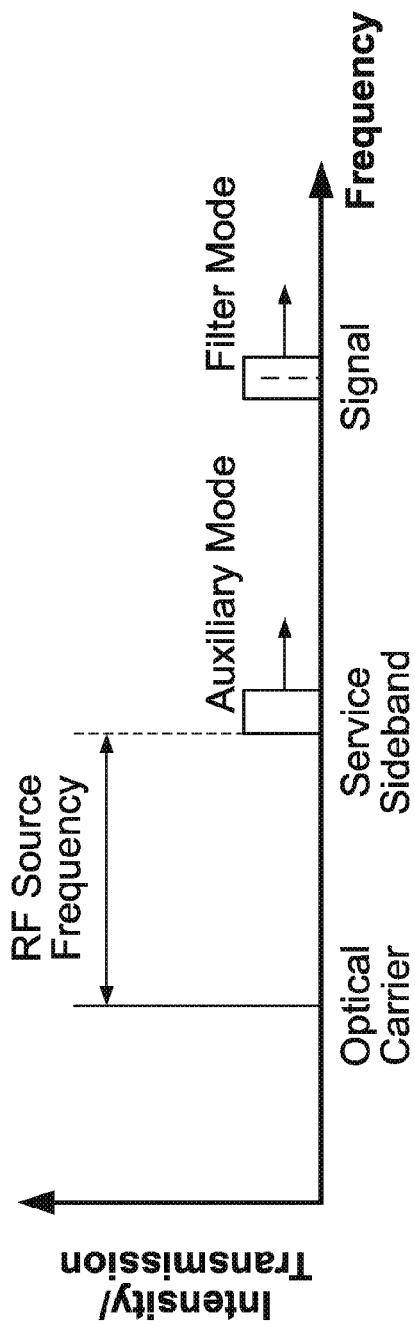

FIG. 10 shows the frequencies discussed above for the thermal stabilization based on the thermal effect of the service sideband in the resonator. Therefore, the presence of the light in the service sideband near the critical coupling condition can locks the filter mode frequency to the laser carrier frequency without a feedback control circuit. In some implementations, a feedback control may be provided to further enhance the thermal stabilization by the service sideband. For example, an optical detector cab be used to monitor the transmission of the light from the resonator in the service sideband and a feedback control can be used to control either the laser frequency of the laser or the temperature of the resonator to ensure that the service sideband be at the slope of the resonance near the critical coupling condition for the service sideband.

In this technique, the auxiliary optical power can be pumped at an entirely different optical frequency, not affecting the signal being filtered at the filter mode frequency. The thermal nonlinearity of the filtering mode can be kept low. The laser frequency may drift over time and the thermal locking via the service sideband can maintain the frequency difference between the laser's carrier and the resonance of wgmr when the laser drifts. Therefore, a laser of high long-term stability is not required for this locking scheme.

Figure 11:
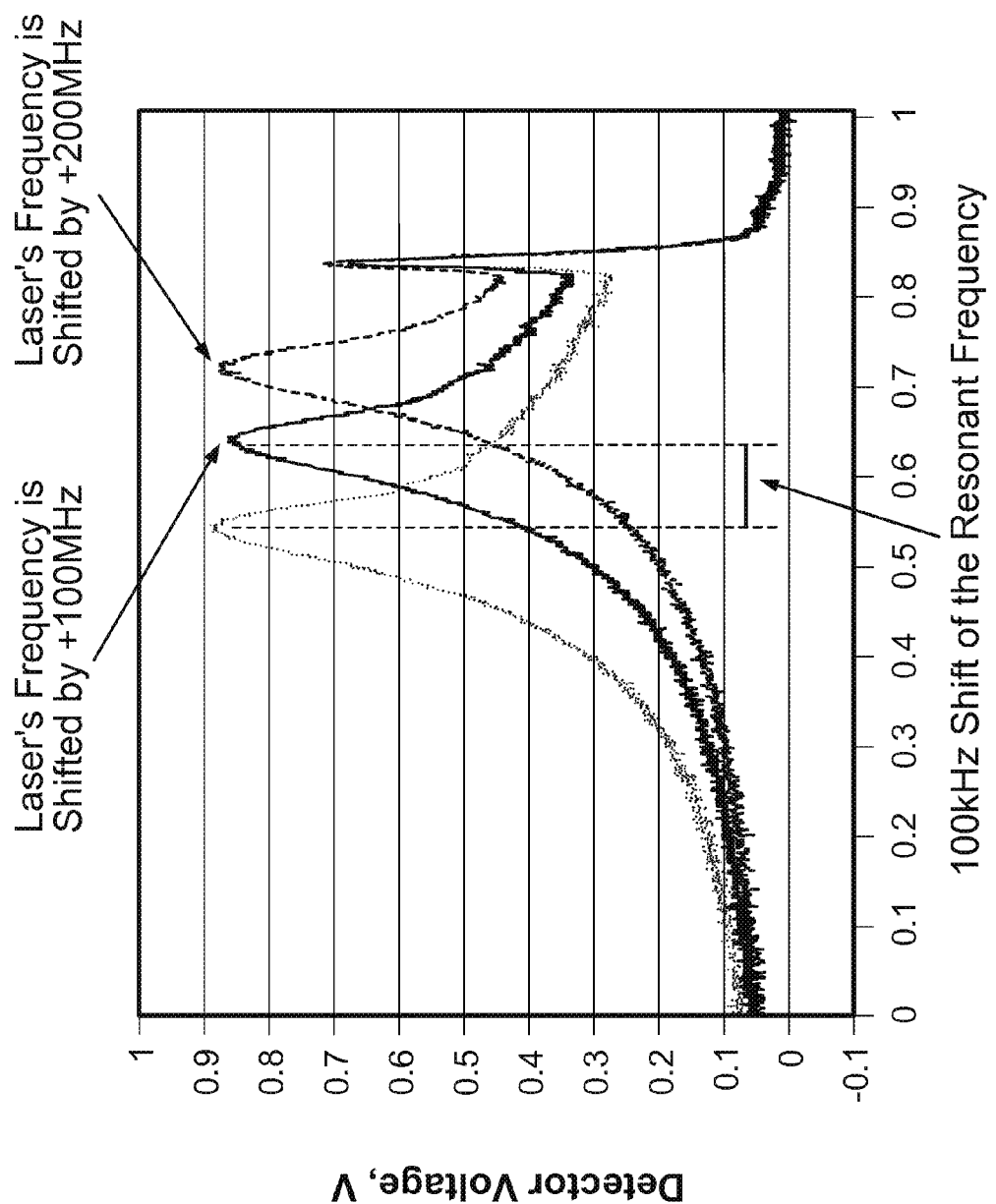

We tested proposed technique with a 200-kHz CaF2 linear wgmr filter, an EO-space modulator and a Koheras 1550-nm laser. To measure the gain of thermal feedback, the laser frequency was shifted by 100 MHz and the relative shift between laser's frequency and the resonant frequency of the mode was measured as shown in FIG. 11. With the service sideband has an optical power of 120 uW, the feedback time constant was measured to be around 500 ms and the gain was about 1000. At power higher than 150 uW, the feedback of this particular setup became unstable.

The measured stability of the frequency difference was about 100 kHz which corresponds to approximately 1 degree of the phase stability in a balanced filter. Further improvements can be achieved with sub-modulated service sidebands at frequencies higher than the frequency of thermo-refractive oscillations. Sub-modulation of this kind suppresses thermo-refractive oscillations, and allows increasing power of service sideband and as a result increasing gain of feedback.

In operating the above optical resonator filter that is stabilized by a service sideband, a resonator controlling laser beam at a laser carrier frequency, that is modulated to carry a modulation sideband, is directed to the optical resonator. The optical coupler is used to couple light at the modulation sideband into the optical resonator near the critical coupling condition to thermally stabilize the resonator by optical absorption of light in the modulation sideband. While the resonator is receiving and is thermally stabilized by the resonator controlling laser beam, an input optical signal is directed through the optical resonator to perform optical filtering of the input optical signal by a resonance of the optical resonator at an optical filter mode frequency that is different from the modulation sideband and the laser carrier frequency of the resonator controlling laser beam.

Another optical locking is locking a laser to a resonator by injection locking. For example, a laser can be locked to a whispering gallery mode (WGM) resonator for line narrowing and stabilization by directing the laser light out of the laser into the WGM resonator and then feeding the laser light out of the WGM resonator via direct injection into the laser. A portion of the light passing through the resonator is reflected back to the laser to have the laser frequency (wavelength) be locked to the frequency of the high Q mode of the resonator, and to narrow its spectral line. If the WGM resonator is stabilized against environmental perturbations such as temperature variations or vibration, the stability of the modal frequency of the resonator is transferred to the laser frequency or wavelength. The WGM resonator can be made from an electro-optic material and can be tuned by changing the electrical control signal applied to the material. Because the optical injection locking, the laser wavelength or frequency can be tuned with the application of a DC voltage applied to the resonator. In addition, by applying a microwave or RF field to the WGM resonator having a frequency that matches one or more free spectral range of the resonator, the laser frequency can be phase, and/or amplitude modulated. Since the modal frequency of the resonator can be varied by application of temperature, pressure, or in the case of resonators made with electrooptic material, an applied DC potential, the frequency (wavelength) of the laser can also be tuned. The laser remains locked in frequency (wavelength) to the resonator if the frequency of the laser is modulated through the application of a microwave signal to the DC current applied to the laser. Thus a modulatable, narrow linewidth laser can be obtained. When the WGM resonator is made of an electro-optic material, a microwave or RF field can be applied to the resonator with the appropriate coupling circuitry to modulate the intensity of the laser, which continues to remain locked to the WGM resonator.

Figure 12:
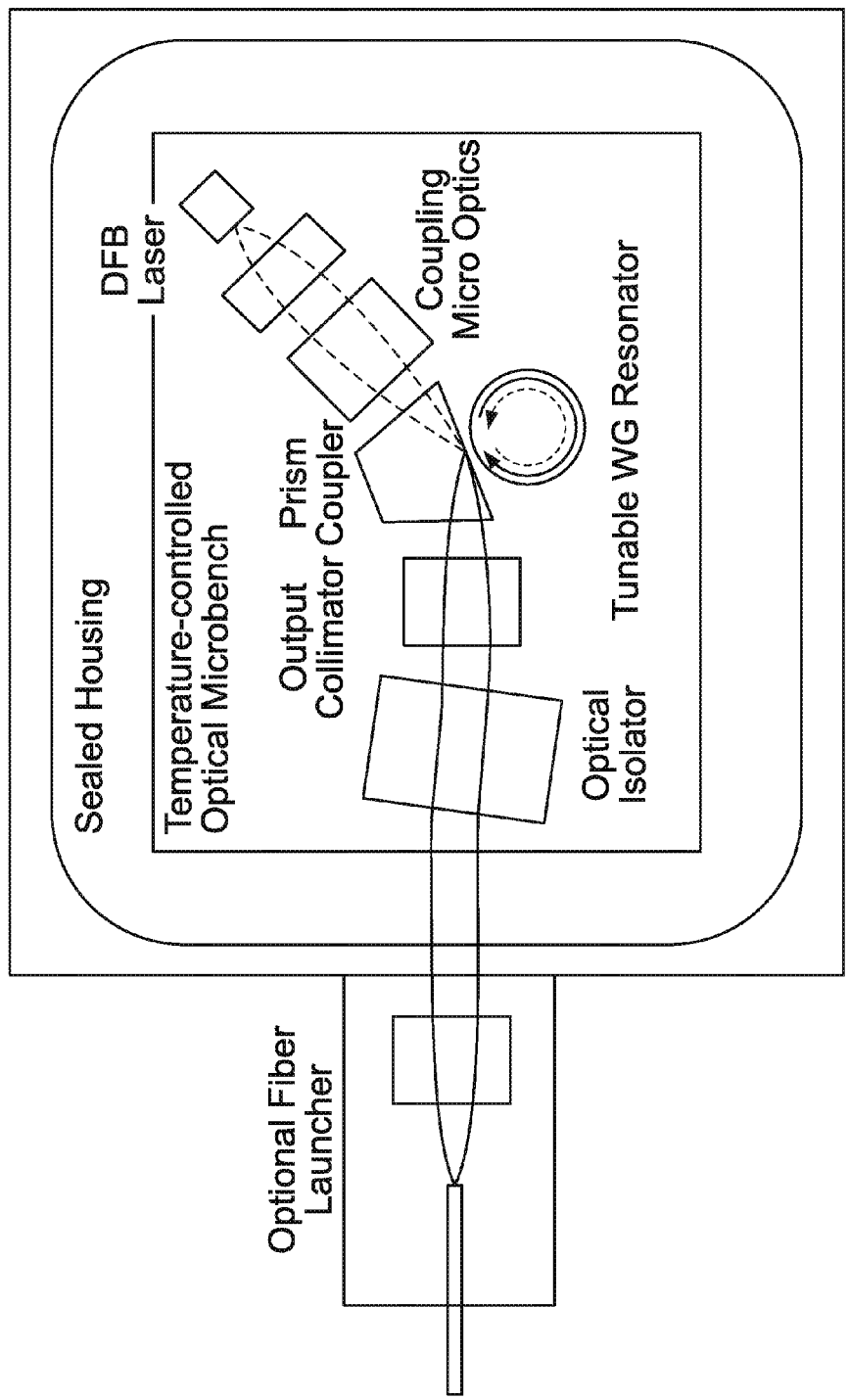
FIG. 12 shows a device for locking a laser to a resonator via injection locking to achieve a narrow laser linewidth.

FIG. 12 shows an example device for locking a laser to an optical resonator. This device includes a distributed feedback (DFB) laser that is tunable in response to a control signal and produces a laser beam at a laser frequency. An optical resonator is structured to support a whispering gallery mode circulating in the optical resonator and optically coupled to the DFB laser to receive a portion of the laser beam into the optical resonator in the whispering gallery mode and to feed laser light in the whispering gallery mode in the optical resonator back to the DFB laser to stabilize the laser frequency at a frequency of the whispering gallery mode and to reduce a linewidth of the DFB laser. This device also includes a resonator tuning mechanism that controls and tunes the frequency of the whispering gallery mode to tune the laser frequency of the DFB laser via the feedback of the laser light from the optical resonator to the DFB laser. The optical coupler in this example is a prism coupler for both input and output coupling. Coupling micro optics is provided between the DFB laser and the resonator. The DFB laser has a high intrinsic Q than other lasers and thus provides a better control over selection of the WG modes in the dense spectrum of a WGM resonator. The WGM resonator can also be tuned or controlled by applied strain such as a PZT actuator that squeezes the resonator or by thermal control. As illustrated, the mount on which the laser device is formed is thermally controlled.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations and enhancements of the described implementations and other implementations can be made based on what is described and illustrated in this document.

What is claimed is:

1. A device that stabilizes a resonance of an optical resonator with respect to a laser frequency from the laser, comprising:

a laser that produces a laser output beam at the laser carrier frequency;

the optical resonator placed in an optical path of the laser output beam to receive light of the laser output beam;

an optical coupler that couples the optical resonator to the optical path to receive the light of the laser output beam and to produce an optical output, the optical coupler structured and positioned relative to the optical resonator to provide, at an optical filter mode frequency different from the laser carrier frequency, optical coupling that is not under a critical coupling condition under which light coupled into the optical resonator is completely trapped inside the optical resonator; and an optical modulator, in the optical path of the laser output beam between the laser and the optical resonator, to modulate the laser output beam to produce a modulation sideband at which optical coupling of the light in the modulation sideband by the optical coupler into the optical resonator is near the critical coupling condition to thermally stabilize the resonator by optical absorption of light in the modulation sideband, wherein the modulation sideband is different in frequency from the optical filter mode frequency.

2. The device as in claim 1, comprising:
a thermal control that controls a temperature of the resonator to make the resonator near the critical coupling condition at the modulation sideband.

3. The device as in claim 1, wherein:
the optical resonator is a whispering gallery mode resonator.

4. The device as in claim 1, comprising:
a mechanism to direct an optical signal with spectral components near the optical filter mode frequency to pass through the optical resonator to optically filter the optical signal by a resonance of the optical resonator at the optical filter mode frequency.

5. A method for operating an optical resonator filter, comprising:
directing to an optical resonator a resonator controlling laser beam at a laser carrier frequency that is modulated to carry a modulation sideband;

operating an optical coupler to couple light at the modulation sideband into the optical resonator near a critical coupling condition under which light coupled into the optical resonator is completely trapped inside the optical resonator to thermally stabilize the resonator by optical absorption of light in the modulation sideband;

directing an input optical signal, while the resonator is receiving and is thermally stabilized by the resonator controlling laser beam, through the optical resonator to perform optical filtering of the input optical signal by a resonance of the optical resonator at an optical filter mode frequency that is different from the modulation sideband and the laser carrier frequency of the resonator controlling laser beam.

6. The method as in claim 5, comprising:
using a thermal control device engaged to the optical resonator to control a temperature of the optical resonator to make the optical resonator near the critical coupling condition at the modulation sideband.

7. The method as in claim 5, wherein:
the optical resonator is a whispering gallery mode resonator.

* * * * *